United States Patent
Ghosh et al.

(10) Patent No.: US 6,706,316 B2
(45) Date of Patent: Mar. 16, 2004

(54) ULTRASONICALLY SEALING THE COVER PLATE TO PROVIDE A HERMETIC ENCLOSURE FOR OLED DISPLAYS

(75) Inventors: Syamal K. Ghosh, Rochester, NY (US); Fugui He, Penfield, NY (US); Harold Moore, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 231 days.

(21) Appl. No.: 09/850,788

(22) Filed: May 8, 2001

(65) Prior Publication Data

US 2002/0187254 A1 Dec. 12, 2002

(51) Int. Cl.⁷ .............................. B05D 5/12; B32B 31/16
(52) U.S. Cl. ........................... 427/58; 427/74; 427/284; 427/369; 427/375; 427/600; 156/73.1
(58) Field of Search ........................... 427/58, 600, 66, 427/74, 375, 271, 277, 359, 369; 156/73.1; 174/52.1–52.5

(56) References Cited

U.S. PATENT DOCUMENTS

| | | | |
|---|---|---|---|
| 3,951,327 A | * | 4/1976 | Snow et al. ................. 228/121 |
| 5,304,419 A | | 4/1994 | Shores |
| 5,401,536 A | | 3/1995 | Shores |
| 5,591,379 A | | 1/1997 | Shores |
| 5,771,562 A | * | 6/1998 | Harvey et al. .............. 29/592.1 |
| 6,195,142 B1 | * | 2/2001 | Gyotoku et al. .............. 349/69 |
| 6,210,815 B1 | * | 4/2001 | Ooishi ......................... 428/690 |
| 2001/0046579 A1 | * | 11/2001 | Ishii et al. .................... 428/68 |
| 2002/0045397 A1 | * | 4/2002 | Tanaka ......................... 445/24 |

FOREIGN PATENT DOCUMENTS

EP 0776147 5/1997

* cited by examiner

Primary Examiner—Brian K. Talbot
(74) Attorney, Agent, or Firm—Raymond L. Owens

(57) ABSTRACT

A method of providing a hermetically sealed enclosure for a highly moisture sensitive electronic device including depositing an electrical conductor on the substrate which provides an electrical connection with the electronic device and depositing an electrically insulating thin layer over the electrical conductor; providing a low melting point indium metal or alloy in the form of a wire having diameter ranging from 1 mil to 10 mils on the electrically insulating thin layer on the substrate so that the wire is situated around the periphery of the electronic device; placing an ultrasonic horn over the cover plate so that ultrasonic energy can be delivered through the cover plate to the wire and applying a pressure between 20 and 100 psi; and providing an acoustic wave to melt the wire.

6 Claims, 2 Drawing Sheets

ULTRASONICALLY SEALING THE COVER PLATE TO PROVIDE A HERMETIC ENCLOSURE FOR OLED DISPLAYS

FIELD OF THE INVENTION

This invention relates to an ultrasonic encapsulation of electronic devices. More particularly, this invention relates to hermetically sealing a moisture sensitive electronic device, such as organic light emitting devices (OLED).

BACKGROUND OF THE INVENTION

It is known in microelectronic industry that in order to be functionally efficient for their intended purposes, certain types of electronic devices must be sealed to protect them from the ambient environment. Various electronic devices require humidity levels in a range of about 2500 to maximum 5000 parts per million (ppm) to prevent premature degradation of device performance within a specified operating and/or storage life of the device. Control of the environment to this range of humidity levels within a packaged device is typically achieved by encapsulating the device and a desiccant within a cover.

Particular electronic devices, for example, OLED, polymer light-emitting devices, charge-coupled device (CCD) sensors, and micro-electro-mechanical sensors (MEMS) require humidity control to levels below about 1000 ppm and some require humidity control below even 100 ppm. Such low levels of humidity are not achievable using commonly used desiccants like silica gel or Drierite® materials. Molecular sieve materials can achieve humidity levels below 1000 ppm within an enclosure if dried at a relatively high temperature. However, molecular sieve materials have a relatively low moisture absorption capacity at humidity levels at or below 1000 ppm. Therefore, the minimum achievable humidity level using molecular sieve materials as a desiccant is a function of temperature within an enclosure. Moisture adsorbed by molecular sieve material, for example, at room temperature, can be released into the enclosure or package during temperature cycling to higher temperature, such as, for example, to a temperature of 100° C. Desiccants used within such packaged devices include metal oxides, alkaline earth metal oxides, sulfates, metal halides, or perchlorates, i.e., materials having desirably relatively low values of equilibrium minimum humidity and high moisture capacity. However, such materials often chemically absorb moisture relatively slowly compared to the above-mentioned molecular sieve, silica gel, or Drierite® materials. Such relatively slow reaction of desiccant with water vapor leads to a measurable degree of device degradation in terms of performance.

Numerous publications describe methods and/or materials for controlling humidity levels within enclosed or encapsulated electronic devices. For example, Kawami et al., European Patent Application EP 0776 147 A1 discloses an organic EL element enclosed in an airtight container which contains a desiccant comprised of a solid compound for chemically absorbing moisture. The desiccant is spaced from the organic EL element, and the desiccant is consolidated in a predetermined shape by vacuum vapor deposition, sputtering, or spin coating.

Shores discloses in U.S. Pat. No. 5,304,419 a moisture and particle getter for enclosures which enclose the electronic device. A portion of an inner surface of the enclosure is coated with a pressure sensitive adhesive containing a solid desiccant.

Shores discloses in U.S. Pat. No. 5,401,536 a method of providing a moisture-free enclosure for an electronic device in which the enclosure contains a coating or adhesive with desiccant properties. The coating or adhesive comprises a protonated alumina silicate powder dispersed in a polymer.

Shores discloses in U.S. Pat. No. 5,591,379 a moisture gettering material composition for hermetic devices. The composition is applied as a coating or adhesive on the interior surface of a device packaging, and the composition comprises a water vapor permeable binder, which has dispersed therein a desiccant which is preferably a molecular sieve material.

However, the use of proper desiccant inside the enclosure of an electronic device may extend the service life, but it does not make the device immune to failure due to moisture permeation from the outside ambient. True hermetic sealing of the electronic components can provide a controlled environment in which the electronic devices function, however, a true and effective hermetic seal is difficult to achieve in all the cases. More particularly it is difficult for OLED because of the temperature restraint. The organic layers in the OLED tend to deteriorate if they are exposed to over 100° C. for any length of time. In the traditional hermetic sealing, as for example, vacuum tube and lamp manufacturing method, elevated temperatures, high vacuum and other means are employed to accomplish that. The OLED displays do not withstand traditional methods of hermetic sealing as mentioned above.

SUMMARY OF THE INVENTION

It is an object of the invention to provide a highly effective hermetically sealed enclosure for moisture sensitive electronic devices.

It is another object of the present invention to provide a method of sealing a cover plate to provide an enclosure using a low temperature metal alloy.

These and other objects are achieved by a method of providing a hermetically sealed enclosure for a highly moisture sensitive electronic device comprising the steps of:
 (a) depositing an electrical conductor on the substrate which provides an electrical connection with the electronic device and depositing an electrically insulating thin layer over the electrical conductor;
 (b) providing a low melting point indium metal or alloy in the form of a wire having diameter ranging from 1 mil to 10 mils on the electrically insulating thin layer on the substrate so that the wire is situated around the periphery of the electronic device;
 (c) placing an ultrasonic horn over the cover plate so that ultrasonic energy can be delivered through the cover plate to the wire and applying a pressure between 20 and 100 psi; and
 (d) providing an acoustic wave from the ultrasonic horn through the cover plate to melt the wire.

It is an advantage of the present invention that the hermetically sealed enclosure provided by the above method prevents moisture from permeating through the seal and thus degrading the enclosed electronic device. The present invention is particularly suitable for use with highly moisture sensitive electronic devices like OLED display.

DETAILED DESCRIPTION OF THE PREFERRED EMBODIMENT

Figure 1:
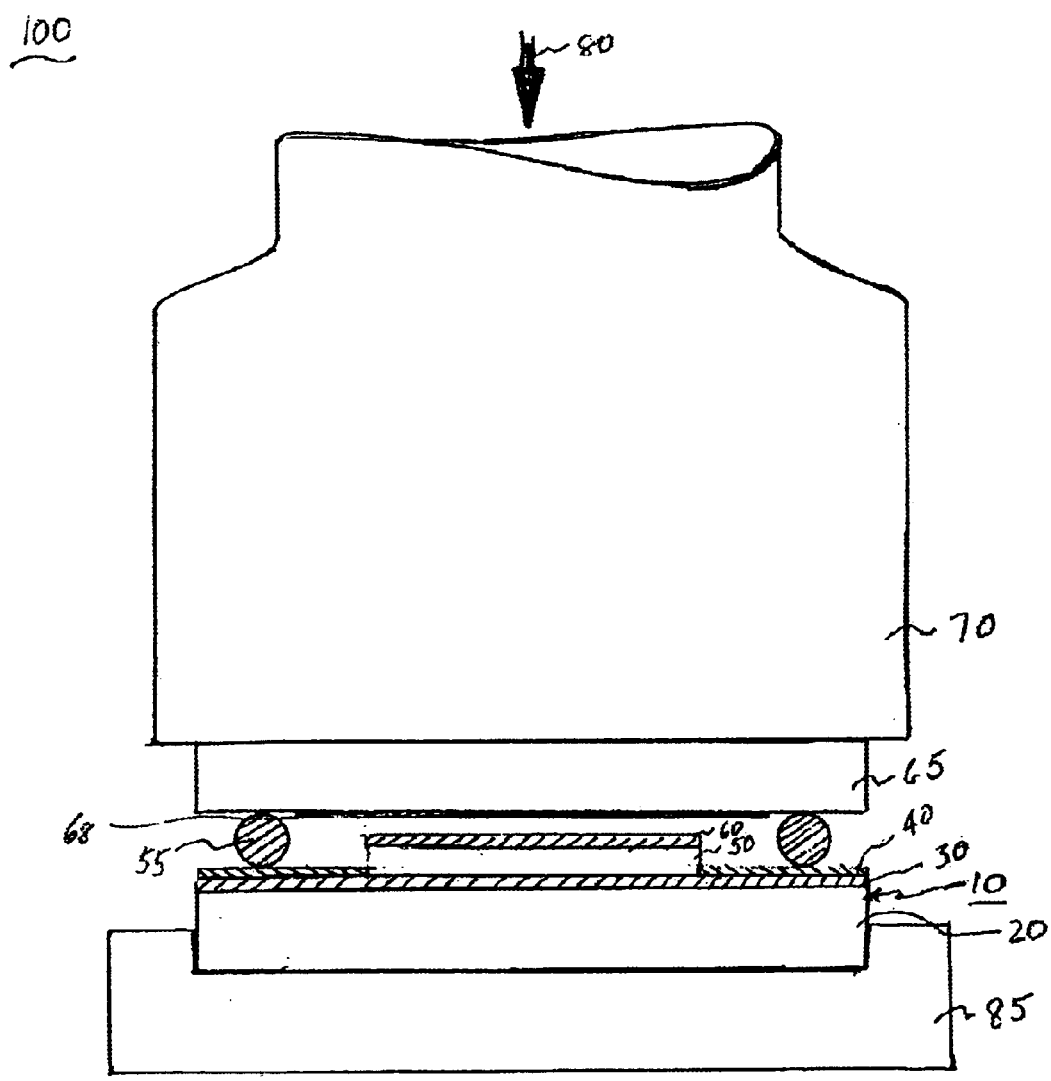
FIG. 1 depicts an ultrasonic sealing arrangement for a moisture-sensitive electronic device.

Referring to FIG. 1, there is shown a sectional view of an ultrasonic sealing arrangement 100 for sealing a moisture sensitive electronic device. More particularly, the extremely moisture sensitive electronic device is OLED 10 in this invention. The OLED 10 has an optically transparent substrate 20 over which is disposed an optically transparent conductive anode 30. The anode 30 provides electrical conduction to the OLED 10. An electrically insulating layer 40 is disposed at the periphery of the OLED 10 to cover and protect the anode 30 from the electrically conductive sealing material 55 which is generally in the form of a wire. The sealing material 55 in the form of a wire can have any cross-section but it is believed a circular cross-section is preferred for ease of handling. Over the central portion of the anode 30 is formed an organic light-emitting layer 50 which comprises at least two layers, namely, an organic hole-transporting layer in contact with the anode 30 and an organic electron-transporting layer in contact with the hole-transporting layer. A cathode 60 is usually formed covering the entire surface area of the electron-transport layer of the OLED 10 having the same physical surface area as that of the OLED 10. Ultrasonic sealing material 55 includes indium metal or indium-based alloys, such as In—Sn, In—Ag and In—Sn—Cd alloys. The sealing material 55 is used preferably in the form of a wire having diameter ranging from 0.001 inch to 0.010 inch. Circular cross-section enabled us to apply lower pressure during the ultrasonic sealing process to effectively form hermetic sealing because the effective pressure is dependent on the wire geometry. As for example, if the sealing material 55 was provided in the form of a thin foil having thickness ranging from 0.001 inch to 0.010 inch, it is obvious that the applied pressure must be well in excess of 100 psi. Alternatively the sealing material 55 can have other desirable shapes. Continuous loop of wire including the sealing material 55 is placed on the electrically insulating coating 40 which is disposed at the periphery of the OLED 10. A cover plate 65, which may be either optically transparent or opaque, such as glass or metal or ceramic, is placed on the sealing material 40, completely covering the OLED 10 but making sure it is spaced apart from the cathode 60. The inside surface of the cover plate 65 is provided with a thin layer 68 of a desiccant which may preferably be calcium oxide or barium oxide or combination thereof, as described in commonly-assigned U.S. patent application Ser. No. 09/543,973, filed Apr. 7, 2000, entitled "Desiccation of Moisture-Sensitive Electronic Devices" by Boroson et al, the disclosure of which is incorporated herein by reference.

The OLED 10 is placed in a recessed holder 85 to make sure that there is no lateral movement when the ultrasonic energy is applied. An ultrasonic horn 70 is placed over the cover plate 65 and an uni-axial pressure 80 is applied in the direction as shown by the arrow. Ultrasonic energy in the form of acoustic wave is delivered through the cover plate to melt the sealing material 55 in the form of a wire. The applied pressure 80 on the cover plate 65 was in the range of 20 to 100 psi when the sealing material 55 was used in the form of a circular wire. The applied pressure 80 must be well over 100 psi when the sealing material has non-circular cross-sectional geometry. Next, the ultrasonic horn is energized using ultrasonic frequency in the range of 20 to 100 kHz for duration of 1 to 10 seconds. Since the ultrasonic horn 70 is in physical contact through the rigid cover plate 65 with the sealing material 55 only, it melts instantaneously and wets and physically bond with the cover plate 65 and the insulating layer 40. The OLED 10 is then allowed to cool for 5 to 10 seconds.

Figure 2:
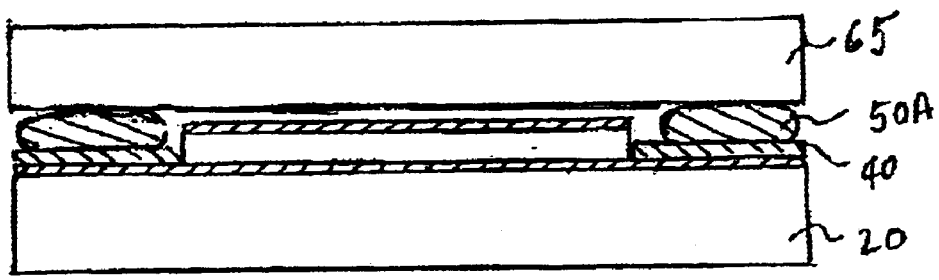
FIG. 2 is an end view of an ultrasonically sealed moisture-sensitive electronic device.

Referring to FIG. 2, there is shown a hermetically sealed OLED display 200. The hermetic seal 50A including indium metal or indium-based alloy physically bonds with the cover plate 65 and the electrically insulating coating 40 thereby making this seal impervious to moisture or water vapor.

The present invention is particularly suitable for use with microelectronic devices which are highly moisture sensitive. It prevents premature device failure or premature degradation of device performance. Furthermore, the present invention is particularly suitable for microelectronic devices which are prone to degradation when exposed to a high temperature.

The invention has been described in detail with particular reference to certain preferred embodiments thereof, but it will be understood that variations and modifications can be effected within the spirit and scope of the invention.

| PARTS LIST | |
|---|---|
| 10 | OLED |
| 20 | optically transparent substrate |
| 30 | optically transparent anode |
| 40 | electrically insulating layer |
| 50 | organic light emitting layer |
| 50A | hermetic seal |
| 55 | sealing material |
| 60 | cathode |
| 65 | cover plate |
| 68 | desiccant layer |
| 70 | ultrasonic horn |
| 80 | applied pressure |
| 85 | recessed holder |
| 100 | ultrasonic sealing arrangement |
| 200 | hermetically sealed OLED display |

What is claimed is:

1. A method of providing a hermetically sealed enclosure for a highly moisture sensitive electronic device, comprising:

(a) depositing an electrical conductor on a substrate which provides an electrical connection with the electronic device and depositing an electrically insulating thin layer over a portion of the electrical conductor;

(b) providing a low melting point indium metal or alloy in the form of a wire having diameter ranging from 1 mil to 10 mils on the electrically insulating thin layer on the substrate so that the wire is situated around a periphery of the electronic device, the wire being disposed within the circumference of a cover plate;

(c) placing an ultrasonic horn over the cover plate so that ultrasonic energy can be delivered through the cover plate to the wire and applying a pressure between 20 and 100 psi; and (d) providing an acoustic wave from the ultrasonic horn through the cover plate to melt the wire.

2. A method of sealing a cover plate to a substrate to provide an enclosure for a highly moisture sensitive electronic device, comprising:

(a) depositing an electrical conductor on a substrate which provides an electrical connection with the electronic device and depositing an electrically insulating thin layer over a portion of the electrical conductor;

(b) providing a low melting point indium metal or alloy in the form of a wire having diameter ranging from 1 mil to 10 mils on the electrically insulating thin layer on the substrate so that the wire is situated around a periphery of the electronic device, the wire being disposed within the circumference of a cover plate;

(c) placing the cover plate in contact with the wire so that the cover plate encloses the electronic device;

(d) placing an ultrasonic horn over the cover plate so that ultrasonic energy can be delivered through the cover plate to the wire and applying a pressure between 20 and 100 psi; and (e) providing an acoustic wave from the ultrasonic horn having acoustic energy of 10 to 100 kHz for 1 to 15 seconds which is transmitted through the cover plate to the wire so that the wire melts and hermetically bonds the cover plate to the substrate and the electrically insulating thin layer.

3. The method of claim 2, further comprising:

(1) cooling the melted wire 5 to 20 seconds.

4. The method of claim 2, further comprising:

a desiccant in the enclosed space between the cover plate and electronic device.

5. The method of claim 2, wherein the device is an OLED display.

6. The method of claim 2, wherein the cover plate is made of glass.

* * * * *